(12) United States Patent
Griswold et al.

(10) Patent No.: US 10,261,154 B2
(45) Date of Patent: Apr. 16, 2019

(54) NUCLEAR MAGNETIC RESONANCE (NMR) FINGERPRINTING TISSUE CLASSIFICATION AND IMAGE SEGMENTATION

(71) Applicant: Case Western Reserve University, Cleveland, OH (US)

(72) Inventors: Mark Griswold, Shaker Heights, OH (US); Yun Jiang, Cleveland Heights, OH (US); Dan Ma, Cleveland, OH (US); Anagha Deshmane, Cleveland Heights, OH (US); Chaitra Badve, Cleveland Heights, OH (US); Vikas Gulani, Shaker Heights, OH (US); Jeffrey L Sunshine, Pepper Pike, OH (US)

(73) Assignee: CASE WESTERN RESERVE UNIVERSITY, Cleveland, OH (US)

( * ) Notice: Subject to any disclaimer, the term of this patent is extended or adjusted under 35 U.S.C. 154(b) by 201 days.

(21) Appl. No.: 14/257,081

(22) Filed: Apr. 21, 2014

(65) Prior Publication Data
US 2015/0301141 A1  Oct. 22, 2015

(51) Int. Cl.
G06K 9/00 (2006.01)
G01R 33/56 (2006.01)
(Continued)

(52) U.S. Cl.
CPC ..... *G01R 33/5608* (2013.01); *G01R 33/4828* (2013.01); *G01R 33/50* (2013.01)

(58) Field of Classification Search
None
See application file for complete search history.

(56) References Cited

U.S. PATENT DOCUMENTS 8,723,518 B2  5/2014 Seiberlich, et al.
2010/0215239 A1*  8/2010 Assaf ............... A61B 5/055
382/131
(Continued)

FOREIGN PATENT DOCUMENTS

DE  102016209885 A1  12/2017

OTHER PUBLICATIONS

Donald B. Twieg "Parsing Local Signal Evolution Directly From a Single-Shot MRI Signal: A New Approach for fMRI", Magnetic Resonance in Medicine 50:1043-1052 (2003).*
(Continued)

*Primary Examiner* — Weiwen Yang
(74) *Attorney, Agent, or Firm* — Quarles & Brady LLP

(57) ABSTRACT

Apparatus, methods, and other embodiments associated with NMR fingerprinting are described. One example NMR apparatus includes an NMR logic that repetitively and variably samples a (k, t, E) space associated with an object to acquire a set of NMR signals that are associated with different points in the (k, t, E) space. Sampling is performed with t and/or E varying in a non-constant way. The NMR apparatus may also include a signal logic that produces an NMR signal evolution from the NMR signals, and a characterization logic that characterizes a resonant species in the object as a result of comparing acquired signals to reference signals. The NMR signal evolution may be assigned to a cluster based on the characterization of the resonant species. Cluster overlay maps may be produced simultaneously based, at least in part, on the clustering. The clusters may be associated with different tissue types.

35 Claims, 15 Drawing Sheets

(51) Int. Cl.
*G01R 33/48* (2006.01)
*G01R 33/50* (2006.01)

(56) References Cited

U.S. PATENT DOCUMENTS

| | | | |
|---|---|---|---|
| 2012/0235678 A1* | 9/2012 | Seiberlich | G01R 33/543 |
| | | | 324/307 |
| 2013/0343625 A1* | 12/2013 | Samsonov | G06T 11/005 |
| | | | 382/131 |
| 2016/0109547 A1 | 4/2016 | Grodzki | |
| 2016/0154078 A1 | 6/2016 | Grodzki | |

OTHER PUBLICATIONS

D. Ma, et al,"Magnetic Resonance Fingerprinting", Nature, Mar. 14, 2013, 187-192, 495-7440, Macmillan Publishers Limited, United States.

B.A. Garner, Modem Legal Use, A Dictionary of Modern Legal Usage, 1995, 624, 2, Oxford University Press Inc., Oxford.

D.B. Twieg et al., Parsing Local Signal Evolution Directly From a SingleÂ- Shot MRI Signal: A New Approach for MRI, Magnetic Resonance in Medicine, Oct. 24, 2003, 1043-1052, 50-5, John Wiely & Sons Inc., United States.

* cited by examiner

1300

NUCLEAR MAGNETIC RESONANCE (NMR) FINGERPRINTING TISSUE CLASSIFICATION AND IMAGE SEGMENTATION

FEDERAL FUNDING NOTICE

This invention was made with government support under the grant number EB017219 awarded by the National Institutes of Health. The government has certain rights in the invention.

BACKGROUND

Conventional magnetic resonance (MR) pulse sequences include a preparation phase, a waiting phase, and an acquisition phase that serially produce signals from which images can be made serially. The preparation phase determines when a signal can be acquired and determines the properties of the acquired signal. For example, a first pulse sequence may be designed to produce a T1-weighted signal at a first echo time (TE) while a second pulse sequence may be designed to produce a T2-weighted signal at a second TE. These conventional pulse sequences are typically designed to provide qualitative results where data are acquired with various weightings or contrasts that highlight a particular parameter (e.g., T1 relaxation, T2 relaxation).

When MR images are generated, they may be viewed by a radiologist and/or surgeon who interprets the qualitative images for specific disease signatures. The radiologist may examine multiple image types (e.g., T1-weighted, T2-weighted) acquired in multiple imaging planes to make a diagnosis. The radiologist or other individual examining the qualitative images may need particular skill to be able to assess changes from session to session, from machine to machine, and from machine configuration to machine configuration. Thus, the images are only as good as the image interpreter and all image based (e.g., qualitative) diagnoses end up being subjective.

Magnetic resonance fingerprinting (MRF) employs a series of varied sequence blocks that simultaneously produce different signal evolutions in different resonant species (e.g., tissues) to which the RF is applied. The term "resonant species", as used herein, refers to an item (e.g., water, fat, tissue, material) that can be made to resonate using NMR. By way of illustration, when example apparatus and methods apply RF energy to a volume that has both bone and muscle tissue, then both the bone and muscle tissue will produce an NMR signal. However the "bone signal" and the "muscle signal" will be different. The different signals can be collected over a period of time to identify a signal evolution for the volume. Resonant species in the volume can then be characterized by comparing the signal evolution to known evolutions. In one embodiment, the "known" evolutions may be, for example, simulated evolutions and/or previously acquired evolutions. Conventional MRF may store a large set of known evolutions in a dictionary. Characterizing the resonant species can include identifying different properties of a resonant species (e.g., T1, T2, diffusion resonant frequency, diffusion co-efficient, spin density, proton density). Additionally, other properties including, but not limited to, tissue types, materials, and super-position of attributes (e.g., T1, T2) can be identified.

MRF is described in U.S. patent application "Nuclear Magnetic Resonance (NMR) Fingerprinting", application Ser. No. 13/051,044, and in *Magnetic Resonance Fingerprinting*, Griswold et al., Nature 495, 187-192 (14 Mar. 2013), the contents of both of which are incorporated herein by reference.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
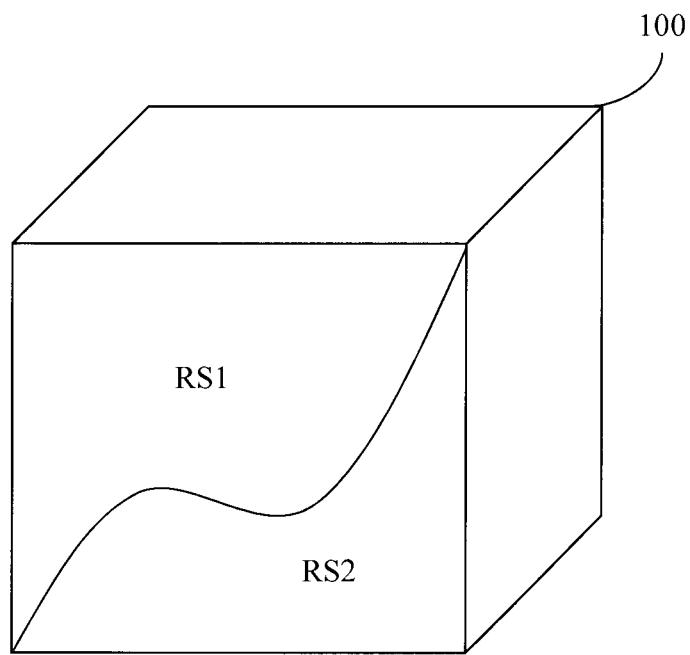
FIG. 1 illustrates a volume that contains two resonant species.

Example methods and apparatus facilitate identifying tissue types based on clusters of data identified using magnetic resonance (MR) parameters retrieved from magnetic resonance fingerprinting (MRF). More generally, example methods and apparatus facilitate distinguishing groups of materials in a volume based on MR parameter-based clusters identified from MR parameters retrieved using MRF. MRF simultaneously provides quantitative maps of multiple MR parameters. The quantitative mapping uses different combinations of MR parameters of interest, (e.g., T1, T2, off-resonance). Observed signal evolutions are matched to dictionary entries using, for example, template matching. In one example, the inner product is computed between a noisy signal and entries in a dictionary to find the stored signal evolution to which an acquired signal evolution matches. Parameter combinations unique to the dictionary entry that matched the acquired noisy signal may then be retrieved and provided. Example apparatus and methods may identify clusters of pixels based on MR parameters retrieved using MRF. Images or data points associated with the clusters of pixels may then be overlaid on a magnetic resonance imaging (MRI) map (e.g., T1 weighted map, T2 weighted map) to present an image of a cluster of pixels that share MR parameters.

MRF efficiently produces quantitative images of tissue parameters using pattern recognition between a dictionary and signals produced in response to the variable excitation schemes associated with MRF. The dictionary may be formed using the Bloch equations to simulate signal evolutions using different combinations of T1 relaxation times, T2 relaxation times, off-resonance frequencies, or other factors. In NMR, MRI, or ESR (electron spin resonance), a Bloch equation is a member of a set of macroscopic equations that are used to calculate the nuclear magnetization $M=(M_x, M_y, M_z)$ as a function of time when relaxation times T1 and T2 are present. These phenomenological equations were introduced by Felix Bloch and may also be referred to as the equations of motion of nuclear magnetization. In one embodiment $Ri(\alpha)$, $R_{RFij}(\alpha,\phi)$, and $R(G)$ may be viewed as Bloch equations.

Example apparatus and methods may denote the MRF dictionary by $D \in C^{n \times t}$, where n is the number of parameter combinations and t is the number of time points. Example apparatus and methods may denote by $d_j$, $j=1, \ldots, n$ the jth row of D. The dictionary match for an observed noisy signal evolution may be determined by a process similar to query or template matching. For example, the observed signal evolution, denoted x, may be compared to dictionary entries by using the complex inner product. The complex inner product may determine which entry in the dictionary matches the signal evolution with highest probability. A dictionary entry $d_l$ may be chosen that satisfies:

$$d_l = \arg\max_{1 \leq j \leq n} |d_j x|$$

where x denotes the vector x and $\|$ represents the modulus. Once the match has been discovered, example apparatus and methods may assign to the material that generated the signal the MR parameters (e.g., T1, T2, off-resonance) associated with the matching entry in the dictionary. In one embodiment, MR parameters associated with dictionary entries may be stored in the dictionary. In another embodiment, MR parameters associated with dictionary entries may be stored outside the dictionary but be retrievable using a dictionary entry or dictionary entry identifier.

Larger objects like human bodies are made up of smaller objects like arms and legs and hips. The smaller objects are in turn made up of smaller parts like skin, muscle, fat, bone, tendon, and prosthetics. These smaller parts are in turn made up of even smaller things like water and minerals. The water and minerals are themselves made up of even smaller things (e.g., hydrogen, oxygen) which in turn are made up of even smaller things (e.g., electrons orbiting a nucleus). The nucleus may include a proton that exhibits "spin". A human body has a large number of protons and thus a large number of spins.

In the presence of a magnetic field provided during magnetic resonance imaging (MRI), some of the spins will align in one direction (e.g., N/S) with respect to that magnetic field while other spins will align in an opposite direction (e.g., S/N) with respect to that magnetic field. MRI manipulates the magnetic field so that a net alignment in one direction is achieved. MRI further manipulates the magnetic field so that local differences in the field are achieved to allow spatial encoding. For example, x, y, and z gradients may be applied to create local variations in the larger magnetic field. The local variations allow the excitation of some spins without the excitation of other spins. Selective excitation is possible because of the Larmor relationship between magnetic fields and spins. The Larmor relationship describes how the frequency at which spins accept RF energy is related to the magnetic field in which the spins are located.

With the local variations created, RF energy may be applied to selected sets of spins associated with a local variation to make those spins behave in a certain way. For example, spins may be forced into a high energy state and forced away from their default alignment. When the RF energy is removed, the spins may return or may be forced to return to their default alignment. Different spins may return to their default alignment at different rates. Similarly, spins may return to their default alignment for different reasons. As the spins return from the forced alignment to the natural alignment, the spins produce a signal that can be detected for a short period of time.

MRI has been used to investigate tissue structure, function, and pathology in a variety of organ systems. Tissue types respond to the magnetic fields applied during MRI according to intrinsic MR parameters including T1, T2, and proton density. The intrinsic MR parameters are related to tissue structure and tissue or tumor microenvironment. A radiologist's ability to distinguish normal tissue from abnormal tissue (e.g., tumor) depends on the relative intensity in MR images of different types of tissue. Different types of MR images (e.g., T1 weighted, T2 weighted, M0 weighted, derived weighting) may be made available to the radiologist. Conventionally, the different types of MR images are produced serially following separate serial acquisitions. Tissue structures, lesions, tumors, or other pathology may be identified based on relative hyper-intense or hypo-intense appearances in the variously weighted images.

MRF manipulates the magnetic field and manipulates the application of RF energy at different frequencies. NMR fingerprinting may employ pseudo-random routines that allow a volume to produce the signal(s) the volume is going to produce in response to a variety of changing conditions created by a variety of changing applications of RF energy. In one embodiment, NMR fingerprinting then compares a signal that evolves from the received signals to known signals received from other acquisitions at other times under similar conditions or to a set of simulated expected or predicted curves. If the received signal evolution matches or can be fit to within a threshold of a known, simulated, or predicted signal evolution, then the volume that generated the signal evolution likely holds the same number, type, and mixture of spins as the volume that produced the matched or fitted signal evolution. Over time, signals associated with normal tissues, normal structures, normal materials (e.g., CSF), abnormal tissues, abnormal structures, or abnormal materials (e.g., compromised CSF) may be acquired and stored. MR parameters associated with those known stored signals may also be stored and related to dictionary entries. Thus, acquired NMR signals can be compared to the stored signals to determine whether the acquired NMR signals are associated with, for example, normal tissue or abnormal tissue.

More generally, first information associated with NMR signals acquired in response to NMR fingerprinting excitation is compared to second information associated with reference responses to NMR fingerprinting excitation to characterize a property of a material subjected to the NMR fingerprinting excitation. Unlike conventional MRI, MRF facilitates simultaneously querying T1, T2, M0, where M0 is the default or natural alignment to which spins align when placed in the main magnetic field, and other MR parameters following a single pseudo-randomized acquisition. The NMR signal produced by a volume following the single pseudo-randomized acquisition may be pattern matched or otherwise compared to a collection (e.g., dictionary) of known signal evolutions. Example apparatus and methods distinguish normal tissue from abnormal (e.g., diseased) tissue using the MR parameter (e.g., T1, T2, M0) maps derived from MRF. Unlike conventional systems, clusters may be generated simultaneously (e.g., in parallel) from the T1, T2, M0 or other MR parameter information that is acquired simultaneously using MRF. Unlike conventional systems, overlays may be constructed simultaneously (e.g., in parallel) from the clusters that are produced simultaneously from the MRF information. Thus, rather than subjecting a patient to multiple serial acquisitions that may take a half hour or more, a patient may experience a much shorter time "in the bore." Similarly, rather than making a radiologist wait for multiple images that are produced serially, the radiologist may be provided with maps and overlaid maps that are produced simultaneously from the MRF data. Additionally, the quality of the MR parameter characterization provided by MRF exceeds that of conventional MRI and thus the clustering of data may be achieved with over 99% accuracy. Conventional clustering systems may be limited to less than 90% accuracy.

The frequency at which water in a volume will accept RF energy is determined by the magnetic field in which the water is located. The frequency can be computed when the magnetic field is known. The frequency at which fat in the same volume will accept RF energy is also determined by the magnetic field in which the fat is located. This frequency can also be computed when the magnetic field is known. Thus, applying multiple frequencies can induce multiple resonant species to resonate. Applying the multiple frequencies under a series of different conditions at different times can cause the resonant species to resonate in different ways. Additionally, applying the multiple frequencies under different conditions at different times can cause the resonant species to resonate and relax in different ways. The different resonations and different relaxations may yield a unique signal evolution for a combination of resonant species. Since the frequency is determined by the magnetic field, the magnetic field may be determined when the frequency is known by analyzing a received signal in light of reference signals.

If a volume only has water, then the volume will only produce one signal. If the volume only has fat, then the volume will also only produce one signal, but it will be a different signal. Different amounts of fat and water in the same volume will yield different signals. The combination of signals acquired under different conditions may yield nearly infinitely unique signal evolutions. While the human body is a complicated thing, from a certain point of view it is not that complicated. Every volume in a human body can only hold a finite set of things arranged in a finite set of ways. Over time, a comprehensive library of reference information including, but not limited to, signal evolutions associated with many of the most relevant combinations of resonant species may be acquired and be available to NMR fingerprinting apparatus. The library may store signals that may be referred to as baseline signatures or known signal evolutions. In different embodiments, the library may store simulated and/or predicted signal evolutions. Thus in different examples, "known" signal evolutions may include previously acquired signal evolutions and/or simulated signal evolutions. Additionally, a dictionary or other reference store may include information that is a function of a signal evolution. For example, two signal evolutions may be combined into a different piece of information. Similarly, a single signal evolution may be transformed into a different piece of information. Both signal evolutions and information derived from, computed from, or that is otherwise a function of a signal evolution, may be stored. Additionally, in one embodiment, a dictionary or other reference store may include information that did not start as a signal evolution or that is not derived from a signal evolution. A dictionary may store signal evolutions associated with normal tissue, abnormal tissue, pathology, tumor, lesion, or other tissues. MR parameters associated with dictionary entries may be stored in the dictionary or stored elsewhere.

Using pattern matching to compare acquired signal evolutions to known signal evolutions may include analyzing a cross-correlation between signal evolutions of different tissues acquired using sequence blocks having different parameters. Ideally, a signal evolution would fit to exactly one member of the multi-dimensional set of known evolutions. However, a signal evolution may have relationships with more than one reference signal. Thus, in one embodiment, comparing a signal evolution to a reference signal may result in an identification of a reference signal with which the signal evolution is related and a measurement characterizing the relationship. For example, a signal evolution may be identified as matching a reference signal to within a desired tolerance. Similarly, a signal evolution may be identified as being x % likely to match a reference signal. In another embodiment, a signal evolution may be identified as being a weighted sum of a number of reference signals. One dimension of the multi-dimensional set could, for example, be associated with a first set of acquisition and/or excitation parameters while a second dimension of the multi-dimensional set could, for example, be associated with a second set of excitation and/or acquisition parameters. Matching acquired signal evolutions to known signal evolutions facilitates assigning a region (e.g., voxel, pixel) from which a signal evolution was acquired to a cluster. A "cluster" as used herein refers to, for example, a Voronoi group produced by k-means cluster analysis.

Tissue relaxation parameters T1 and T2, or the corresponding reciprocal rates R1 and R2, may be identified for voxels in a volume. The volume may be, for example, a portion of a human anatomy. The relaxation parameters may be acquired using MRF. In one embodiment, a k-means analysis is performed on T1/T2 or R1/R2 data. While T1/T2 or R1/R2 is described, other k-means analysis may be performed on other sets or combinations of MR parameters. The k-means analysis may identify centroids of N clusters. The k-means analysis may also identify T1/T2 pairs that belong to members of the N clusters. The T1/T2 pairs may be identified based, for example, on a distance metric (e.g., Euclidean distance to cluster centroid). In one embodiment, the number N of clusters may be user-defined. The number N may be selected based, for example, on the number of expected tissue material components. For example, a four component analysis may be used for a healthy brain to identify the T1/T2 characteristics of grey matter, white matter, cerebrospinal fluid (CSF), and "noise" voxels whose signals cannot be attributed to the other three categories. In another example, a seven component analysis may be used on a brain slice known to contain tumor to identify the T1/T2 characteristics of grey matter, normal white matter, CSF, tumor core, tumor edema, aggressive tumor growth regions, and noise. Maps with overlays that depend on data located in different clusters may then be produced.

The maps may show pixels that matched different identified components. The matching of signal evolutions associated with a pixel to known signal evolutions, which provides the MR parameters upon which clustering may be made, may be performed using MRF. In the four and seven component analysis described above for brain tissues, the collections of pixels matching identified components may reveal structures in the brain containing selected tissues. For example, pixels identified in a grey matter cluster may appear in the cortex of the brain while pixels identified with CSF may appear in the ventricles. For analyses of other tissues, pixels matching other identified components may reveal structures in other organs (e.g., liver, kidney, lung), structures (e.g., bone), regions, or other anatomy. While tissues and brains are described, more generally, clusters of regions (e.g., pixels, voxels) having related signal evolutions may be produced and overlaid onto an MR map (e.g., T1 weighted, T2 weighted, M0 weighted).

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable storage medium", as used herein, refers to a non-transitory medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"User", as used herein, includes but is not limited to one or more persons, software, computers or other devices, or combinations of these.

A brief review of MRF is provided herein with respect to FIGS. 1 through 3 and 9. FIG. 1 illustrates a volume 100 (e.g., voxel) that contains two resonant species RS1 and RS2. RS1 and RS2 may have different properties (e.g., relaxation parameters, non-relaxation parameters). For example, $T1_{RS1}$ may be less than $T1_{RS2}$ while $T2_{RS1}$ may be greater than $T2_{RS2}$. In another example, a spin density for RS1 may differ from a spin density for RS2. Conventional MR systems may acquire a T1 weighted data set in a first acquisition and then acquire a T2 weighted data set in a second acquisition and then register the data sets. MRF systems apply RF energy in a series of varied sequence blocks that cause volume 100 to simultaneously produce different NMR signals from both RS1 and RS2. A signal evolution can be produced from these simultaneously produced different NMR signals. Information including relaxation parameters (e.g., T1, T2), and non-relaxation parameters (e.g., diffusion coefficient, spin density, proton density, magnetic field strength) can be determined from the signal evolution by comparing the acquired signal to reference information. In one embodiment, the comparing may include pattern matching to other signal evolutions for which relaxation parameters are known. The resonant species RS1 and RS2 can then be characterized. Since different tissues have different known properties (e.g., relaxation parameters, non-relaxation parameters), different tissues can be identified using the characterization. While two resonant species are illustrated, a volume may include a greater or lesser number of resonant species.

Figure 2:
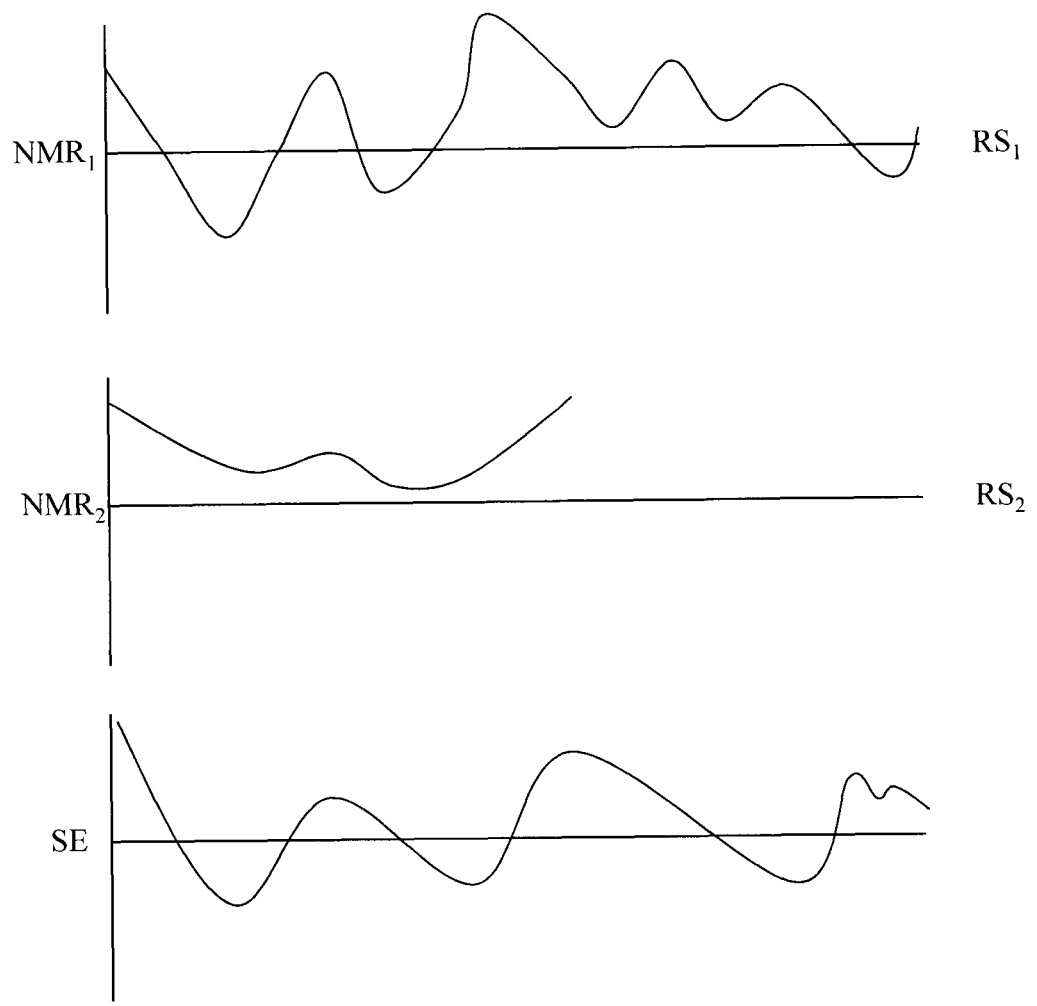
FIG. 2 illustrates two individual NMR signals received from two resonant species and a signal evolution derived from the two individual NMR signals.

FIG. 2 illustrates plots of two individual NMR signals $NMR_1$ and $NMR_2$ received from the two resonant species RS1 and RS2 in volume 100. $NMR_1$ includes data points generated by RS1 under different conditions at different times. $NMR_2$ includes data points generated by RS2 under the different conditions at the different times. Signal evolution SE results from $NMR_1$ and $NMR_2$ being generated and acquired simultaneously. The space from which the data points for $NMR_1$ and $NMR_2$ is acquired may be referred to as a (k, t, E) space, where in different examples, E refers to (T1, T2, D), (T1, T2, D, . . . ), (T1, T2, . . . ) where D refers to diffusion relaxation. In one example, both t and E may be non-linear. In another example, both t and E may be pseudo-random. Once again, while two plots associated with two resonant species are illustrated, a volume may include a greater or lesser number of resonant species and thus may produce a greater or lesser number of signals.

Figure 3:
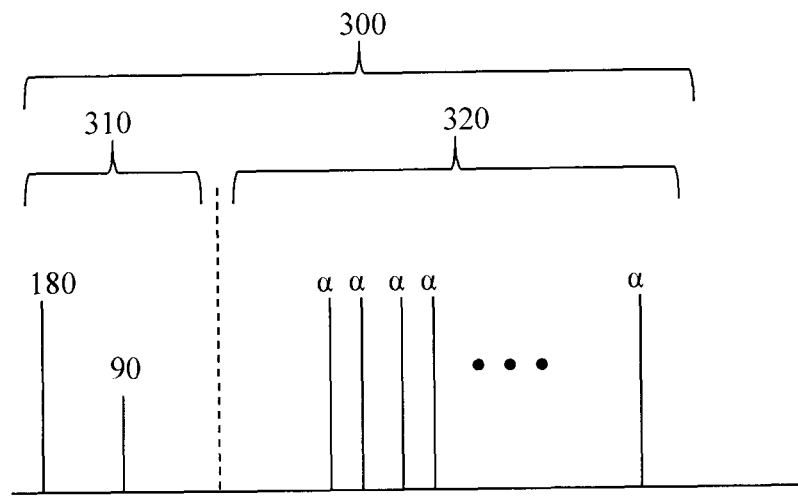
FIG. 3 compares and contrasts conventional sequence blocks to example sequence blocks.
Figure 3:
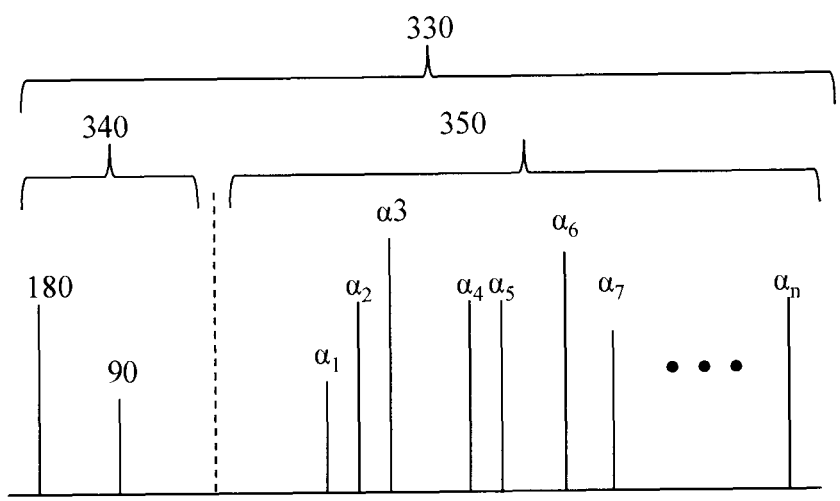

FIG. 3 compares and contrasts conventional MR sequence blocks to MRF sequence blocks. Sequence block 300 includes a preparation phase 310 and an acquisition phase 320. During acquisition phase 320, multiple acquisitions using the same flip angle and the same interval between acquisitions may be performed. Sequence block 330 also includes a phase 340 and an acquisition phase 350. Notice that acquisition phase 350 is much longer than acquisition phase 320. Unlike acquisition phase 320 where parameters are either fixed or vary linearly, in acquisition phase 350 the parameters may vary widely, either non-linearly, randomly, and/or pseudo-randomly. Parameters that may vary include, but are not limited to, echo time, flip angle, phase encoding, and others. Note also that while phase 340 may, in some examples, be a preparation phase or preparation-like phase, phase 340 does not necessarily perform a conventional preparation.

Figure 9:
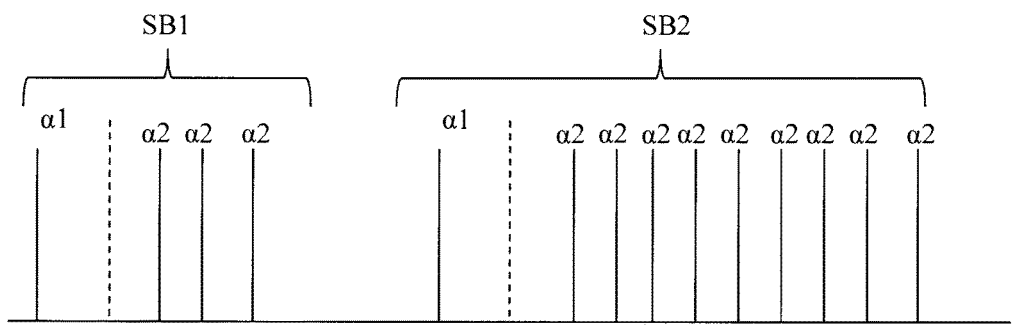
FIG. 9 illustrates an example set of sequence blocks.

FIG. 9 illustrates another example set of sequence blocks. A first sequence block SB1 has a first alpha pulse $\alpha 1$ and a series of identical $\alpha 2$ pulses. A second sequence block SB2 has the same first alpha pulse $\alpha 1$ and a different series of identical $\alpha 2$ pulses. The phase may be the same for the $\alpha 2$ pulses. Thus, in this example, the only difference between members of the set of sequence blocks is the number of $\alpha 2$ pulses.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 4:
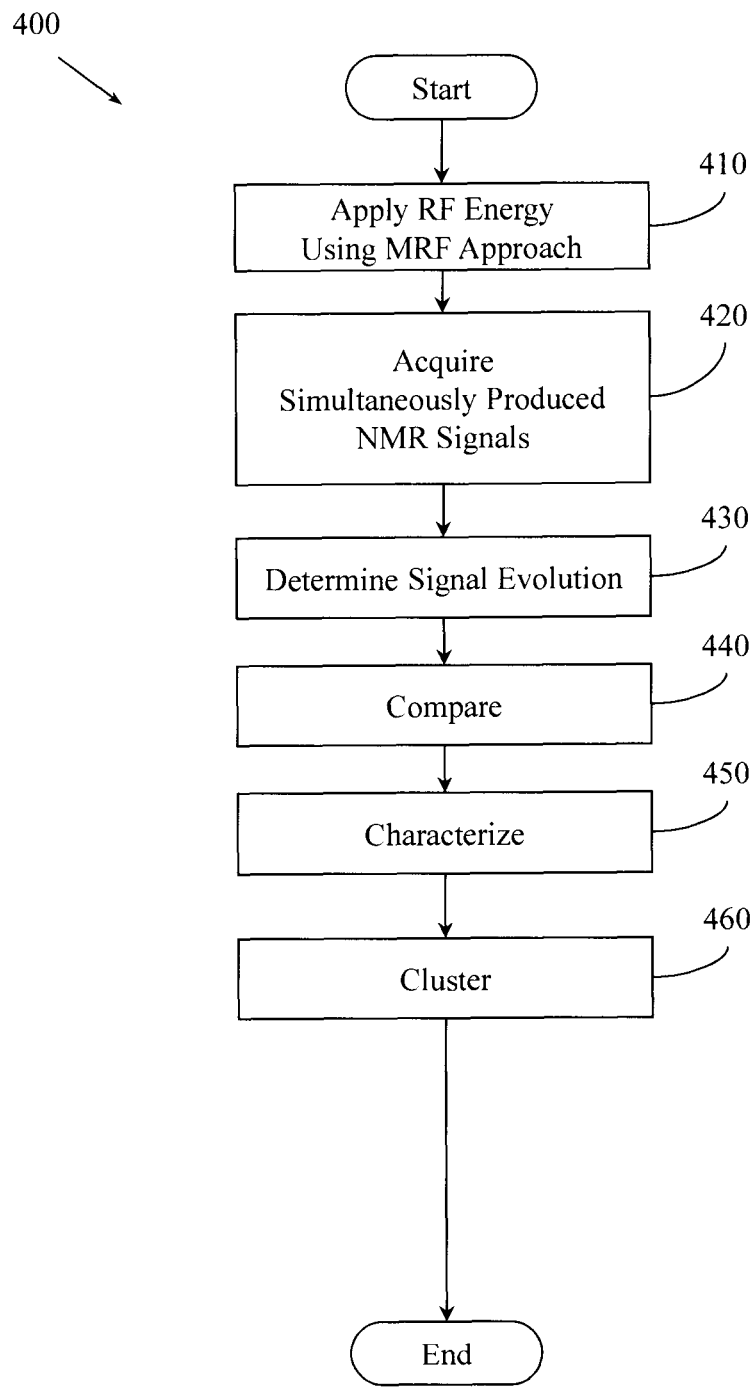
FIG. 4 illustrates an example method for tissue classification and image segmentation.

FIG. 4 illustrates a method 400 associated with tissue classification and image segmentation using MR parameters provided by NMR fingerprinting. Method 400 includes, at 410, controlling an NMR apparatus to apply RF energy to a volume in an object. The volume may contain one or more resonant species. In one embodiment, the object may be a human and thus resonant species may include, but are not limited to, tissue, tumors, fat, water, hydrogen, and metal and plastics of prosthetics or other orthopedic hardware. The RF energy may be applied in a series of variable sequence blocks. Sequence blocks may vary in a number of parameters including, but not limited to, echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling. In different embodiments two, three, four, or more parameters may vary between sequence blocks. In different embodiments, the number of parameters varied between sequence blocks may itself vary. For example, A1 (sequence block 1) may differ from A2 in five parameters, A2 may differ from A3 in seven parameters, and A3 may differ from A4 in two parameters. There are a nearly infinite number of series of sequence blocks that can be created by varying this large number of parameters. In one embodiment, a series of sequence blocks is crafted so that the series have different amounts (e.g., 1%, 2%, 5%, 10%, 50%, 99%, 100%) of unique sequence blocks as defined by their varied parameters. In different embodiments, a series of sequence blocks may include more than ten, more than one hundred, more than one thousand, more than ten thousand, and more than one hundred thousand sequence blocks. In one example, the difference between consecutive sequence blocks may be the number of $\alpha 2$ pulses as illustrated in FIG. 9.

The RF energy applied during a sequence block causes different individual resonant species to simultaneously produce individual NMR signals. Unlike conventional MR systems, at least one member of the series of variable sequence blocks will differ from at least one other member of the series of variable sequence blocks in at least N sequence block parameters, N being an integer greater than one. The signal content of a signal evolution may vary directly with N. Thus, as more parameters are varied, a potentially richer signal is retrieved. Richer signals may be compared to signals in a dictionary to identify MR parameters.

In one embodiment, the NMR apparatus may be controlled at 410 to apply members of the series of variable sequence blocks according to a partially random acquisition plan that under-samples the object at an under-sampling rate R. In different embodiments, rate R may be, for example, two, four, or greater.

Method 400 also includes, at 420, controlling the NMR apparatus to acquire the simultaneously produced individual NMR signals. Method 400 also includes, at 430, controlling the NMR apparatus to determine a signal evolution from the acquired NMR signals. Determining the signal evolution may include storing (k, t, E) space data points acquired during action 420. While an individual sequence block may yield a single point in (k, t, E) space, the signal evolution is determined by the series of variable sequence blocks.

In one embodiment, the simultaneously produced signals are acquired at 420 over a first period of time and the signal evolution is determined at 430 over a second period of time. In different embodiments the first period of time may be ten seconds or longer, sixty seconds or longer, or even longer. Additionally, in different embodiments, the second period of time may be ten seconds or longer, sixty seconds or longer, or even longer.

Method 400 also includes, at 440, comparing first information (e.g., observed signal evolution) to reference information (e.g., MRF dictionary entries). The reference information may include signal evolutions associated with healthy tissue, normal tissue, abnormal tissue, diseased tissue, tumors, lesions, or other pathology. The first information may be, for example, the signal evolution. The reference information may be, for example, known, stored, simulated, and/or predicted signal evolutions. The reference information may also include information that is produced as a function of a known, stored, simulated, or predicted signal evolution. The reference information may be produced by, for example, transforming a signal evolution, combining signal evolutions, decomposing signal evolutions, and other operations. In different examples, the "stored" signal evolutions may include previously acquired signals, simulated signals, or both. In one embodiment, the stored signal evolutions are associated with signals not acquired from the object while in another embodiment the stored signal evolutions are associated with signals acquired from the object. In one embodiment, the stored signals may be associated with signals acquired from the object being analyzed and signals not acquired from the object being analyzed.

The stored signals and information derived from reference signal evolutions may be associated with a potentially very large data space. The data space for signal evolutions can be partially described by:

$$SE = \sum_{s=1}^{N_S} \prod_{i=1}^{N_A} \sum_{j=1}^{N_{RF}} R_i(\alpha) R_{RF_{i,j}}(\alpha, \varphi) R(G) E_i(T1, T2, D) M_0$$

where:
SE is a signal evolution,
$N_S$ is a number of spins,
$N_A$ is a number of sequence blocks,
$N_{RF}$ is a number of RF pulses in a sequence block,
$\alpha$ is a flip angle,
$\varphi$ is a phase angle,
$R_i(\alpha)$ is a rotation due to off resonance,
$R_{RF_{i,j}}(\alpha,\varphi)$ is a rotation due to RF differences,
$R(G)$ is a rotation due to a gradient,
T1 is spin-lattice relaxation,
T2 is spin-spin relaxation,
D is diffusion relaxation,
$E_i(T1,T2,D)$ is associated with magnetization changes, and
$M_0$ is the default or natural alignment to which spins align when placed in the main magnetic field.

While $E_i(T1,T2,D)$ is provided as an example, in different embodiments, $E_i(T1,T2,D)$ may actually be $E_i(T1, T2, D, \ldots )$, or $E_i(T1,T2, \ldots )$.

Additionally or alternatively, the summation on j could be replaced by a product on j, e.g.:

$$SE = \sum_{s=1}^{N_S} \prod_{i=1}^{N_A} \sum_{j=1}^{N_{RF}} R_i(\alpha) R_{RF_{i,j}}(\alpha, \varphi) R(G) E_i(T1, T2, D) M_0$$

In one embodiment, the dictionary may store signals described by:

$$S_i = R_i E_i (S_{i-1})$$

where:
$S_0$ is the default or equilibrium magnetization,
$S_i$ is a vector that represents the different components of magnetization Mx, My, Mz during acquisition block i,
$R_i$ is a combination of rotational effects that occur during acquisition block i, and
$E_i$ is a combination of effects that alter the amount of magnetization in the different states for acquisition block i. In this embodiment, the signal at acquisition block i is a function of the previous signal at acquisition block i–1. Additionally or alternatively, the dictionary may store signals described by:

$$S_i = R_i E_i \sum_{x=1}^{i-1} R_x E_x (S_x)$$

or $$S_i = R_i E_i \Pi_{x=1}^{i-1} R_x E_x (S_x)$$

In this embodiment, the signal is a function of the current relaxation and rotation effects and of previous acquisitions. Additionally or alternatively, the dictionary may store signals described by:

$$S_i = \sum_{s=1}^{N_S} R_{s,i} E_{s,i} (S_{s,i-1})$$

In this embodiment, voxels have multiple resonant species or spins, and the effects may be different for every spin within a voxel. Additionally or alternatively, the dictionary may store signals described by:

$$S_i = \sum_{s=1}^{N_S} R_{s,i} E_{s,i} \sum_{x=1}^{i-1} R_{s,x} E_{s,x} (S_{s,x})$$

or $$S_i = \sum_{s=1}^{N_S} R_{s,i} E_{s,i} \Pi_{x=1}^{i-1} R_{s,x} E_{s,x} (S_{s,x})$$

In this embodiment, voxels may have multiple resonant species or spins, and the effects may be different for spins within a voxel, and thus the signal may be a function of the effects and the previous acquisition blocks.

Method 400 also includes, at 450, controlling the NMR apparatus to characterize at least one of the resonant species. In one embodiment, the characterizing may be a function of comparing the signal evolution to one or more stored (e.g., known, simulated, predicted) signal evolutions. Comparing the acquired signal evolution to a stored signal evolution may include, for example, controlling the NMR apparatus to compare the signal evolution to members of a multi-dimensional set of NMR signal evolutions. A first dimension in the multi-dimensional set may be associated with a first set of sequence block parameters and a second dimension in the multi-dimensional set may be associated with a second, different set of sequence block parameters. Since a signal evolution evolves over time, the multi-dimensional set may include a time dimension and the pattern matching process may include a path matching process that monitors the progress of the signal evolution. Additionally, since one series of varied sequence blocks may differ from another series of varied sequence blocks, the multi-dimensional set may include an order dimension where once again the pattern matching process may path match as opposed to just pattern matching.

Characterizing a resonant species may include, for example, identifying relaxation parameters including, but not limited to, T1 relaxation associated with the resonant species, T2 relaxation associated with the resonant species, off-resonance relaxation associated with the resonant species, and diffusion weighted relaxation associated with the resonant species. Characterizing a resonant species may also include, for example, identifying properties that are not relaxation parameters including, but not limited to, diffusion coefficients, spin density, proton density, magnetic field strength, gradient field strength, tissue type, and material type.

Method 400 also includes, at 460, assigning image locations to clusters based on their MR parameters. Areas (e.g., pixels) or volumes (e.g., voxels) associated with acquired NMR signals may be characterized at 450 using the MR parameters provided by MRF. Once the characterization has been made and the MR parameters for the area, volume, or other collection are available, an image location associated with the area, volume or other collection may be assigned to a cluster based on the characterization or on the MR parameters. In one embodiment, the assignment may be made based on the results of k-means analysis or clustering. K-means analysis is a method for quantization of vectors. K-means analysis or clustering partitions n observations into k clusters in which each observation belongs to the cluster with the nearest mean. The nearest mean may be a "seed value" that serves as a prototype for the cluster. Example seed values may have been computed from previously acquired signals or from signals stored in the dictionary. The result of k-means clustering is a partitioning of the data space into Voronoi cells. The data space may be the combinations of MR parameters that are being analyzed. For example, the data space may be a combination of T1 and T2.

While FIG. 4 illustrates various actions occurring in serial, it is to be appreciated that various actions illustrated in FIG. 4 could occur substantially in parallel. By way of illustration, a first process could control applying RF energy, a second process could control acquiring NMR signals and determining a signal evolution, a third process could perform comparisons, and a fourth process could produce clusters. While four processes are described, it is to be appreciated that a greater and/or lesser number of processes could be employed.

Method 400 may be performed using, for example, an inversion recovery (IR) TrueFISP-based MRF sequence. TrueFISP refers to Fast Imaging with Steady state Precession. TrueFISP is a coherent technique that uses a fully balanced gradient waveform. The image contrast with TrueFISP may be determined by T2*/T1 properties. A TrueFISP-based MRF sequence may be used to acquire fingerprints from a 2D imaging slice through the brain of a glioblastoma patient volunteer. MRF analysis of the data acquired from the glioblastoma volunteer yielded maps of T1, T2, M0 and off-resonance.

Figure 5:
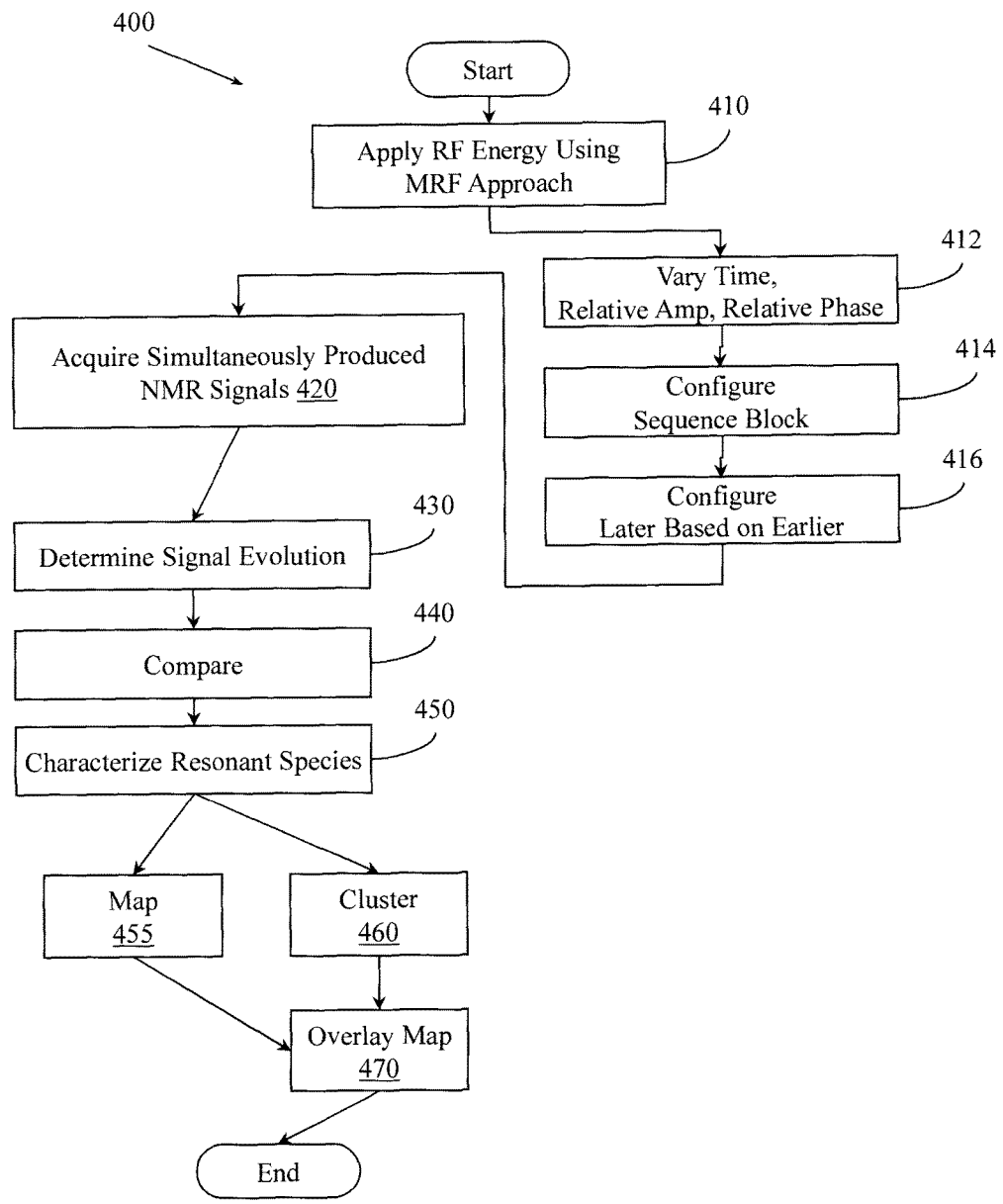
FIG. 5 illustrates an example method for tissue classification and image segmentation.

FIG. 5 illustrates another embodiment of method 400 (FIG. 4). This embodiment includes actions 410, 420, 430, 440, and 450. However, this embodiment also includes actions 412, 414, 416, 455, 460, and 470. This embodiment of method 400 includes, at 412, controlling the NMR apparatus to vary one or more of, the amount of time between sequence blocks, the relative amplitude of sequence blocks, and the relative phase of sequence blocks. Thus, not only can the individual parameters (e.g., flip angle, phase) be varied between sequence blocks, but the times between sequence blocks and other differences between sequence blocks can be varied. This facilitates creating additional signal content in the signal evolution. Additional signal content in the signal evolution may produce a more complicated signal evolution to be compared against the dictionary.

This embodiment of method 400 also includes, at 414, controlling the NMR apparatus to configure a member of the series of variable sequence blocks as one of, a TrueFISP pulse sequence, a FLASH pulse sequence, and a TSE pulse sequence. Action 414 illustrates that a set of MRF sequence blocks is not necessarily the same thing as a conventional MR pulse sequence. An MRF sequence block differs from a conventional pulse sequence for at least the reason that non-linearly varying $\Delta t$ and $\Delta E$, which produce NMR signals in (k, t, E) space having non-constant amplitudes and phases are encouraged, not prohibited.

This embodiment of method 400 also includes, at 416, controlling the NMR apparatus to configure a later member of the series of variable sequence blocks based, at least in part, on an NMR signal acquired in response to applying an earlier member of the series of variable sequence blocks. Thus, this embodiment of method 400 is an adaptive method where the order of members of the series of varied sequence blocks may not be known ahead of time. Instead, as data points in (k, t, E) space are acquired, and as a signal evolves, decisions concerning different sequence blocks and different sets of parameters to vary may be made. By way of illustration, a first number of data points in (k, t, E) space and an evolving signal may be leading towards one relaxation parameter determination and away from another relaxation parameter determination. Therefore, sequence blocks that can confirm and/or reject either of these leads may be applied next in the series to facilitate a guided and more rapid convergence in the pattern matching process.

This embodiment of method 400 also includes, at 455, producing one or more MR maps from a plurality of acquired NMR signals. The MR maps may be, for example, T1 weighted maps, T2 weighted maps, or other MR maps produced from MRF data. In one embodiment, since T1, T2 or other MR parameters may be acquired simultaneously by MRF, the two or more different MR maps may be produced in parallel from a plurality of acquired NMR signals.

Figure 10:
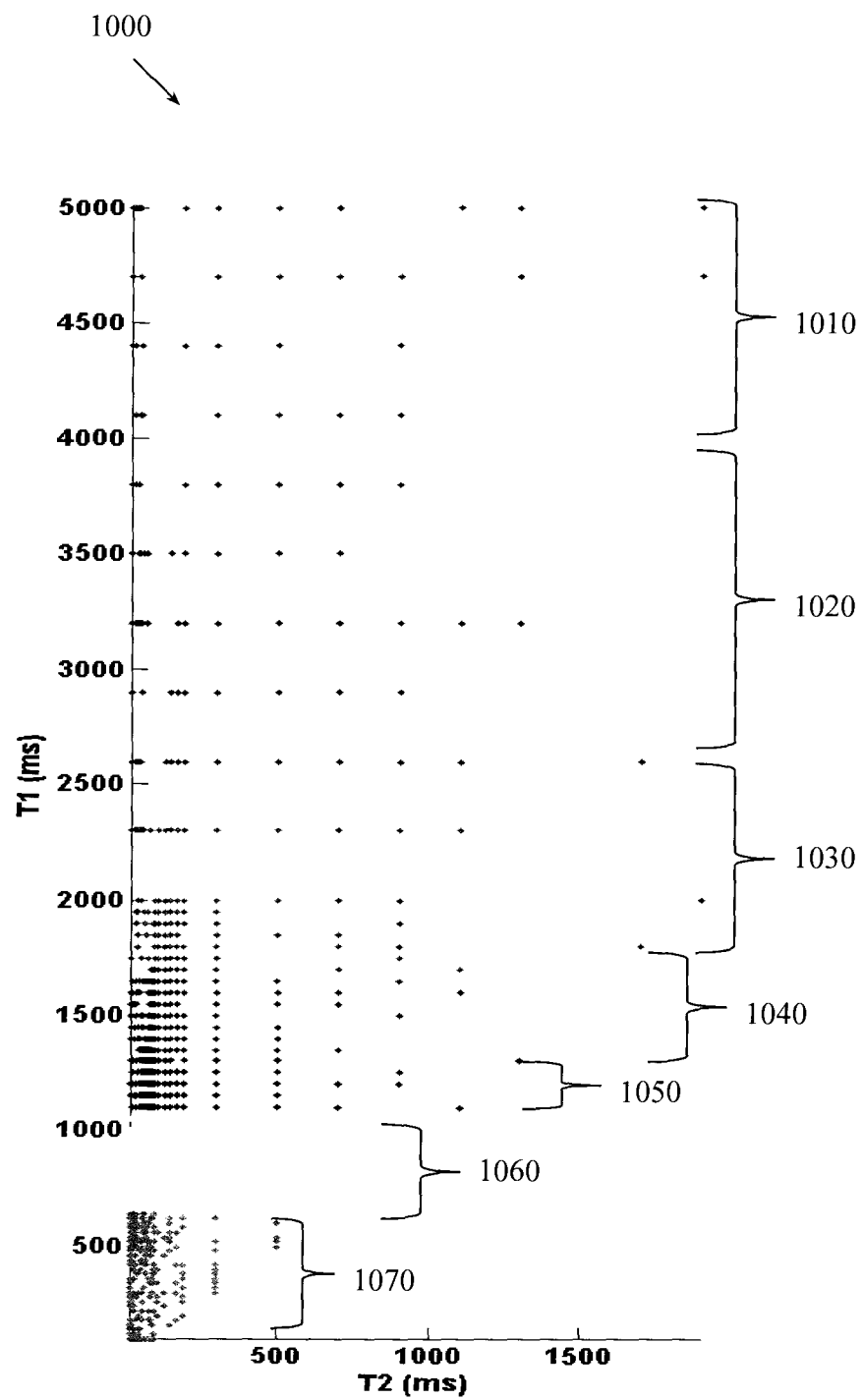
FIG. 10 illustrates clusters identified in a scatter plot.

This embodiment of method 400 also includes, at 460, clustering data and, at 470, producing an overlay from clustered data. Clustered data is illustrated in FIG. 10, which shows a scatter plot 1000 of T1 and T2 values estimated from a brain slice that was examined using a TrueFISP-based MRF sequence. Scatter plot 1000 is associated with a 7-component k-means analysis that was performed where seven clusters were identified. Recall that k-means analysis or clustering is a method for quantization of vectors. K-means analysis or clustering partitions n observations into k clusters in which each observation belongs to the cluster with the nearest mean. The nearest mean serves as a prototype for the cluster. The result of k-means clustering is a partition of the data space into Voronoi cells.

In one embodiment, the clustering at 460 includes assigning a volume to a cluster using k-means clustering, where k is a number that identifies the number of clusters into which a data space associated with the acquired NMR signal is partitioned. In one example, the plurality of clusters may include a cluster associated with normal tissue and a cluster associated with abnormal tissue. The clusters may be used to analyze data received from a volume that is located in a human brain. When the volume is located in a human brain, a set of clusters may include a cluster associated with grey matter, a cluster associated with white matter, and a cluster associated with cerebrospinal fluid (CSF). When the volume is located in a tissue that may be cancerous, a set of clusters may include a cluster associated with a tumor core, a cluster associated with tumor edema, and a cluster associated with an aggressive tumor growth region.

In one embodiment, a member of the plurality of clusters may be defined by a relationship between two MR parameters. The two MR parameters may be, for example, T1 and T2. In another embodiment, a member of the plurality of clusters may be defined by a relationship between three MR parameters. The three MR parameters may be, for example, T1, T2, and M0, M0 being the default or natural alignment to which spins align when placed in the main magnetic field.

Examining scatter plot 1000 reveals that cluster 1010 had the longest T1 and the widest range of T2. Cluster 1020 had the second longest T1 and the second widest range of T2. Cluster 1030 had the third longest T1 and the third widest range of T2. Cluster 1040 had the fourth longest T1 and the fourth widest range of T2. Cluster 1050 had the fifth longest T1 and the fifth widest range of T2. Cluster 1060 had the sixth longest T1 and the sixth widest range of T2. Cluster 1070 had the shortest T1 and the most narrow range of T2. Example apparatus and methods may produce clusters where data is included in the correct cluster with an accuracy exceeding 99%. Conventional non-MRF based systems may yield an accuracy of less than 90%.

Figure 11:
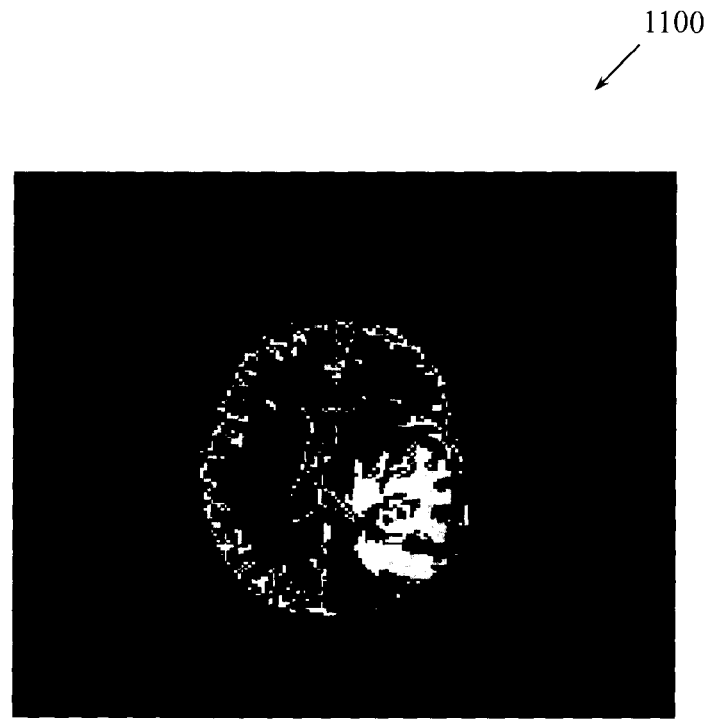
FIG. 11 illustrates data associated with a cluster overlaid on an MR map.
Figure 12:
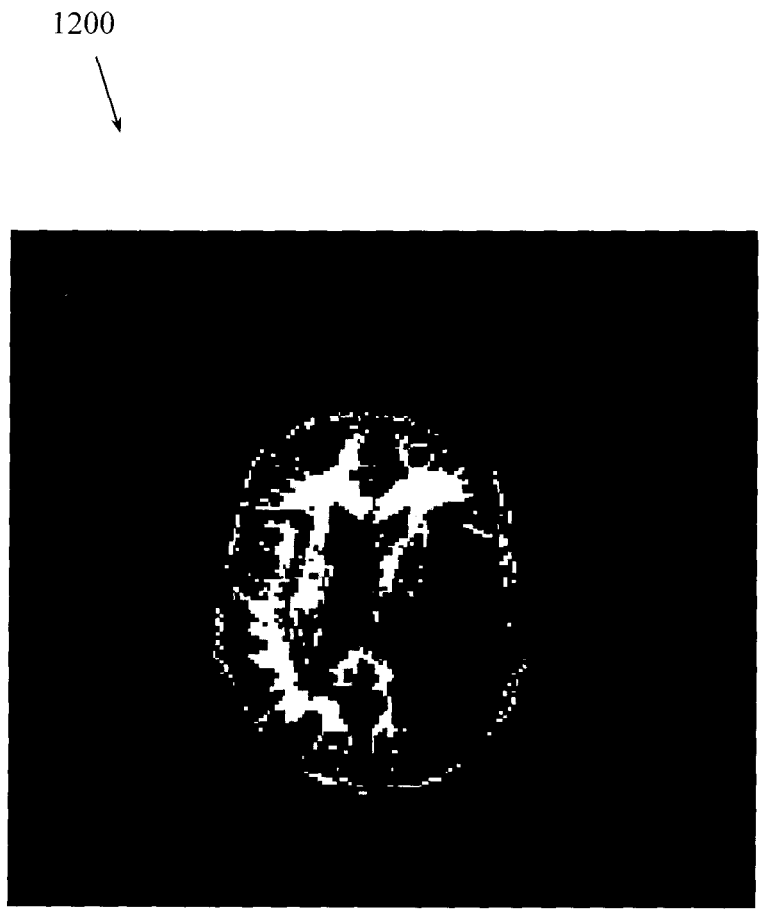
FIG. 12 illustrates data associated with a cluster overlaid on an MR map.
Figure 13:
FIG. 13 illustrates data associated with a cluster overlaid on an MR map.

Producing the overlays and then merging (e.g., superimposing) an overlay on an MR map produces figures like those illustrated in FIGS. 11-13. In FIGS. 11-13, pixels with the T1/T2 values assigned to the clusters were superimposed on top of the T1 map to identify structures in the brain that corresponded to the tissue types associated with the clusters. FIG. 11 illustrates that pixels clustered into cluster 1020 based on their T1/T2 values are located predominantly in an aggressive growing region of a tumor. FIG. 12 illustrates that pixels clustered into cluster 1030 are identified with normal appearing white matter. FIG. 13 illustrates that pixels clustered into cluster 1060 identify the capsule of the tumor. Thus, example methods and apparatus have demonstrated the ability to identify tissue types based on T1/T2 clusters or other MR parameter clusters identified using MR parameters retrieved from MRF.

Figure 6:
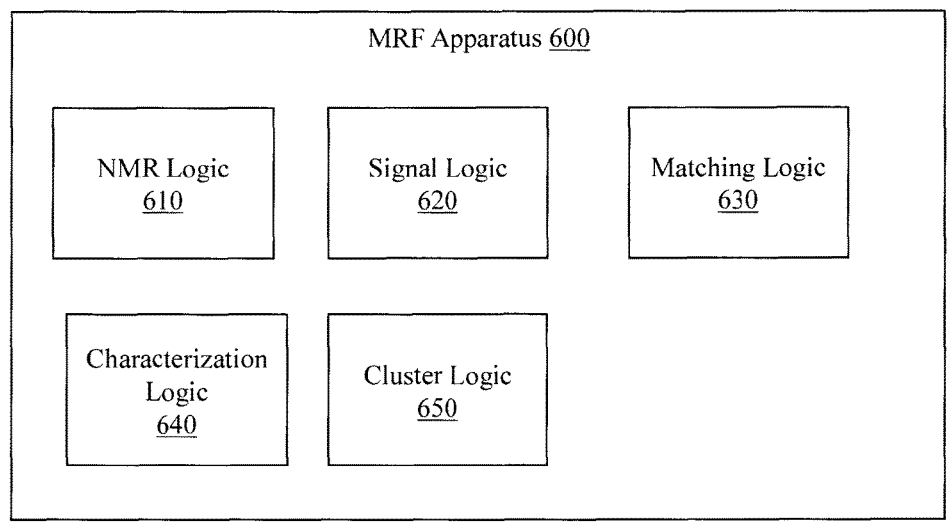
FIG. 6 illustrates an example apparatus associated with tissue classification and image segmentation.

FIG. 6 illustrates an MRF apparatus 600. MRF apparatus 600 identifies tissue types as, for example, normal or abnormal (e.g., diseased) tissue. More generally, MRF apparatus 600 clusters data received in response to MRF excitation. Clustering the data facilitates, for example, segmenting an image. Segmenting an image facilitates distinguishing different collections of related materials or resonant species in an image. In one embodiment, MRF apparatus 600 provides an MR image that facilitates identifying certain tissues based on their relative hypo-intense or hyper-intense appearance on an MR image (e.g., T1 weighted image, T2 weighted image). In one embodiment, MRF apparatus 600 also provides cluster-based images that facilitate segmenting structure or tissues appearing elsewhere in a region of interest (e.g., brain, organ) that share similar tissue properties as determined by MR parameter clustering. While T1 and T2 are the MR parameters described in connection with FIGS. 10-13, other MR parameters may also be used in clustering operations. While two MR parameters were used to produce clusters and overlays in FIGS. 10-13, other numbers and combinations of MR parameters may also be used in clustering operations. For example, clustering can be performed in a higher dimension that includes T1, T2, and M0. Pathology may be compared with tissues identified in images to match structures identified using the imaging technique to actual tissues present in a region of interest (e.g., brain).

MRF apparatus 600 includes an NMR logic 610. NMR logic 610 repetitively and variably samples an object in a (k, t, E) space to acquire a set of NMR signals that may have non-constant amplitude and/or phase. Members of the set of NMR signals are associated with different points in the (k, t, E) space. In different embodiments the different points are sampled according to a plan where t and/or E varies non-linearly and/or in a non-constant manner.

MRF apparatus 600 also includes a signal logic 620. Signal logic 620 produces an NMR signal evolution from the NMR signals. The signal evolution may include a number of NMR signals acquired over a period of time.

MRF apparatus 600 also includes a matching logic 630. Matching logic 630 compares the produced NMR signal evolution or information associated with the produced NMR signal evolution to reference information. The reference information may be, for example, a previously acquired signal evolution, a simulated signal evolution, an item derived from a signal evolution other than the produced NMR signal evolution, and other information. The reference information may include signal evolutions from different tissue types (e.g., healthy, diseased, advanced disease).

MRF apparatus 600 also includes a characterization logic 640. Characterization logic 640 characterizes a resonant species in the object. Characterizing the resonant species may include identifying relaxation parameters including, but not limited to, T1 relaxation, T2 relaxation, diffusion weighted relaxation, and off-resonance relaxation. Characterizing the resonant species may also include identifying non-relaxation parameters including, but not limited to, diffusion co-efficient, spin density, proton density, tissue type, and material type. The MR parameters may be retrieved from a data store that links stored MR parameters to the reference information.

MRF apparatus 600 also includes a cluster logic 650. Cluster logic 650 may assign a location in the object that produced the first set of data to a cluster selected from a plurality of clusters. The plurality of clusters may represent Voronoi groups produced by a k-means analysis. The plurality of clusters facilitate segmenting an MR parameter data space associated with the object. In one embodiment, the cluster logic 650 selects the cluster from the plurality of clusters in response to performing a k-means clustering analysis on the MR parameters associated with the selected stored signal evolution. In one embodiment, the cluster logic 650 assigns the location in the object with an accuracy of at least 99.7%. In one embodiment, clusters may be associated with different types of human tissue.

While matching logic 630, characterization logic 640, and cluster logic 650 are illustrated as being part of MRF apparatus 600, in one embodiment, the matching logic 630, characterization logic 640, or cluster logic 650 may reside in an apparatus separate from the MRF apparatus 600. In this embodiment, MRF apparatus 600 may provide NMR signals to the separate apparatus housing matching logic 630, characterization logic 640, or cluster logic. In one embodiment, matching logic 630, characterization logic 640, and cluster logic 650 may reside in separate apparatus.

Figure 7:
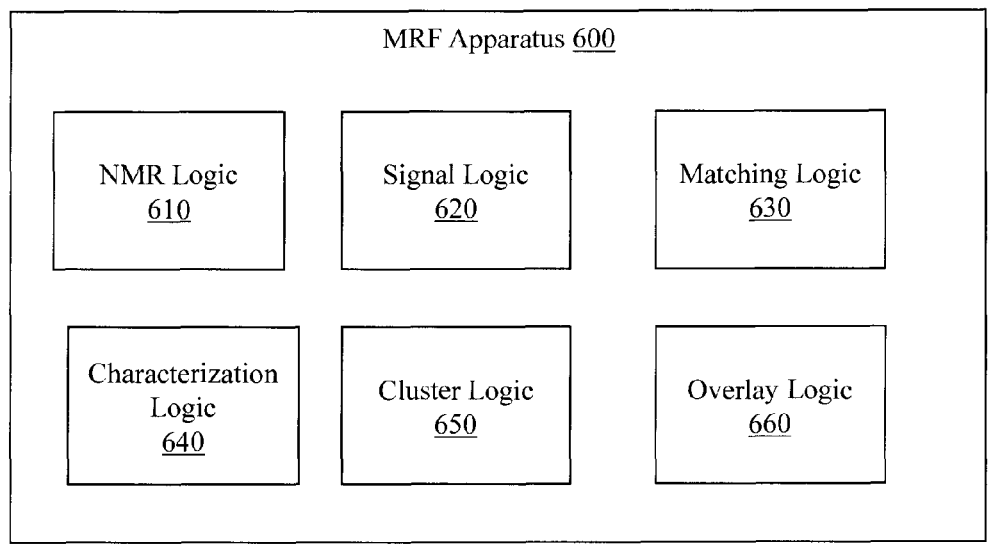
FIG. 7 illustrates an example apparatus associated with tissue classification and image segmentation.

FIG. 7 illustrates another embodiment of apparatus 600 (FIG. 6). This embodiment of apparatus 600 includes an overlay logic 660. Overlay logic 660 may produce an overlay for an MR image. An overlay may provide data from one or more clusters from the plurality of clusters. An overlay may be, for example, a displayable image that can be merged with another displayable image (e.g., an MR map). An overlay may also be, for example, a set of information from which displayable data may be produced.

Figure 8:
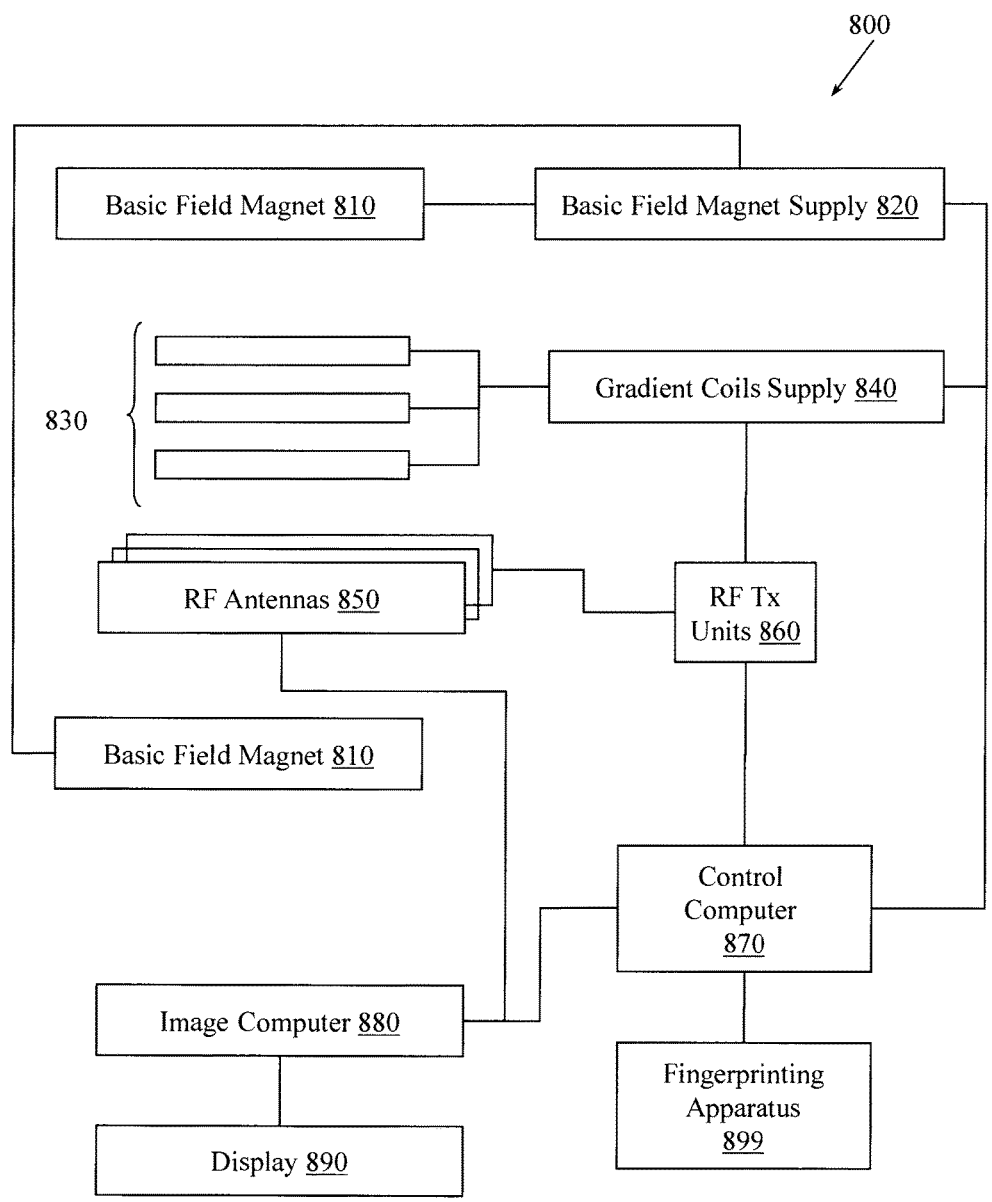
FIG. 8 illustrates an MR apparatus associated with tissue classification and image segmentation.

FIG. 8 illustrates an example MR apparatus 800 configured with a fingerprinting apparatus 899 to facilitate MR fingerprinting. The fingerprinting apparatus 899 may be configured with elements of example apparatus described herein and/or may perform example methods described herein. While fingerprinting apparatus 899 is illustrated as part of MR apparatus 800, in one example, fingerprinting apparatus 899 may be a separate apparatus or apparatuses.

The apparatus 800 includes a basic field magnet(s) 810 and a basic field magnet supply 820. Ideally, the basic field magnets 810 would produce a uniform $B_0$ field. However, in practice, the $B_0$ field may not be uniform, and may vary over an object being analyzed by the MR apparatus 800. MR apparatus 800 may include gradient coils 830 configured to emit gradient magnetic fields like $G_S$, $G_P$ and $G_R$. The gradient coils 830 may be controlled, at least in part, by a gradient coils supply 840. In some examples, the timing, strength, and orientation of the gradient magnetic fields may be controlled, and thus selectively adapted, during an MR procedure.

MR apparatus 800 may include a set of RF antennas 850 that generate RF pulses and to receive resulting nuclear magnetic resonance signals from an object to which the RF pulses are directed. In some examples, how the pulses are generated and how the resulting MR signals are received may be controlled and thus may be selectively adapted during an MR procedure. Separate RF transmission and reception coils can be employed. The RF antennas 850 may be controlled, at least in part, by a set of RF transmission units 860. An RF transmission unit 860 may provide a signal to an RF antenna 850.

The gradient coils supply 840 and the RF transmission units 860 may be controlled, at least in part, by a control computer 870. In one example, the control computer 870 may be programmed to control an NMR device as described herein. Conventionally, the magnetic resonance signals received from the RF antennas 850 can be employed to generate an image and thus may be subject to a transformation process like a two dimensional FFT that generates pixilated image data. The transformation can be performed by an image computer 880 or other similar processing device. The image data may then be shown on a display 890.

However, fingerprinting apparatus 899 facilitates not having to do conventional reconstruction of an image from MR signals received from the RF antennas 850. Thus the RF energy applied to an object by apparatus 800 need not be constrained to produce signals with substantially constant amplitudes or phases. Instead, fingerprinting apparatus 899 facilitates matching received signals to known signals for which a reconstruction, relaxation parameter, or other information is already available.

While FIG. 8 illustrates an example MR apparatus 800 that includes various components connected in various ways, it is to be appreciated that other MR apparatus may include other components connected in other ways. In one embodiment, characterizing the object includes providing information concerning items including, but not limited to, T1 associated with the object, T2 associated with the object, a diffusion coefficient associated with the object, a spin density associated with the object, a proton density associated with the object, a magnetic field to which the object was exposed, a gradient field to which the object was exposed, a tissue type of the object, and an identification of the object.

Figure 14:
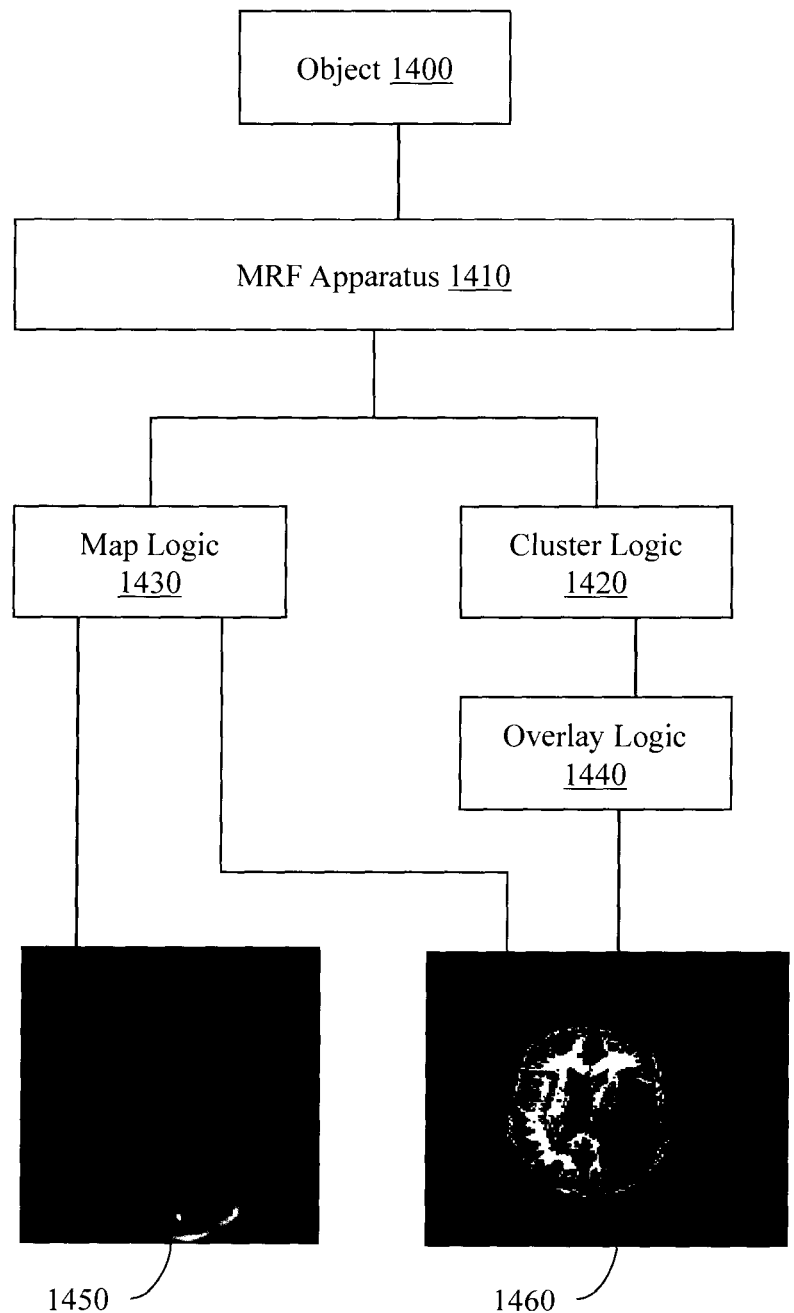
FIG. 14 illustrates a map and an overlay being produced simultaneously from MR parameter data produced by an MRF apparatus.

FIG. 14 illustrates an object 1400 that is being analyzed by an MRF apparatus 1410. MRF apparatus 1410 simultaneously produces MR parameters that are provided to a cluster logic 1420 and to a map logic 1430. Map log 1430 produces an MR map 1450 (e.g., T1 weighted, T2 weighted, M0 weighted). Cluster logic 1420 identifies clusters of pixels that share MR parameters. In one embodiment, pixels are assigned to a cluster with an accuracy of greater than 99%. In another example, pixels are assigned to a cluster with an accuracy of greater than 99.9%. Conventional cluster systems that do not receive inputs from MRF apparatus may only achieve an accuracy of 90% or less.

Cluster data is provided to overlay logic 1440. Overlay logic 1440 and map logic 1430 co-operate to produce an overlaid map 1460. Overlaid map 1460 may present a combination of pixels that are associated with a single cluster and a particular MR map. For example, pixels associated with a first cluster may be overlaid (e.g., superimposed, combined) on a T1 weighted map while pixels associated with a second cluster may be overlaid on a T2 weighted map. While a single overlaid map 1460 is illustrated, overlay logic 1440 and map logic 1430 may co-operate to produce a plurality of overlaid maps 1460. Since MR parameters are acquired simultaneously in MRF, the plurality of overlaid maps 1460 may be produced simultaneously (e.g., in parallel). Tissues and structures may then be identified from the overlaid map 1460.

Figure 15:
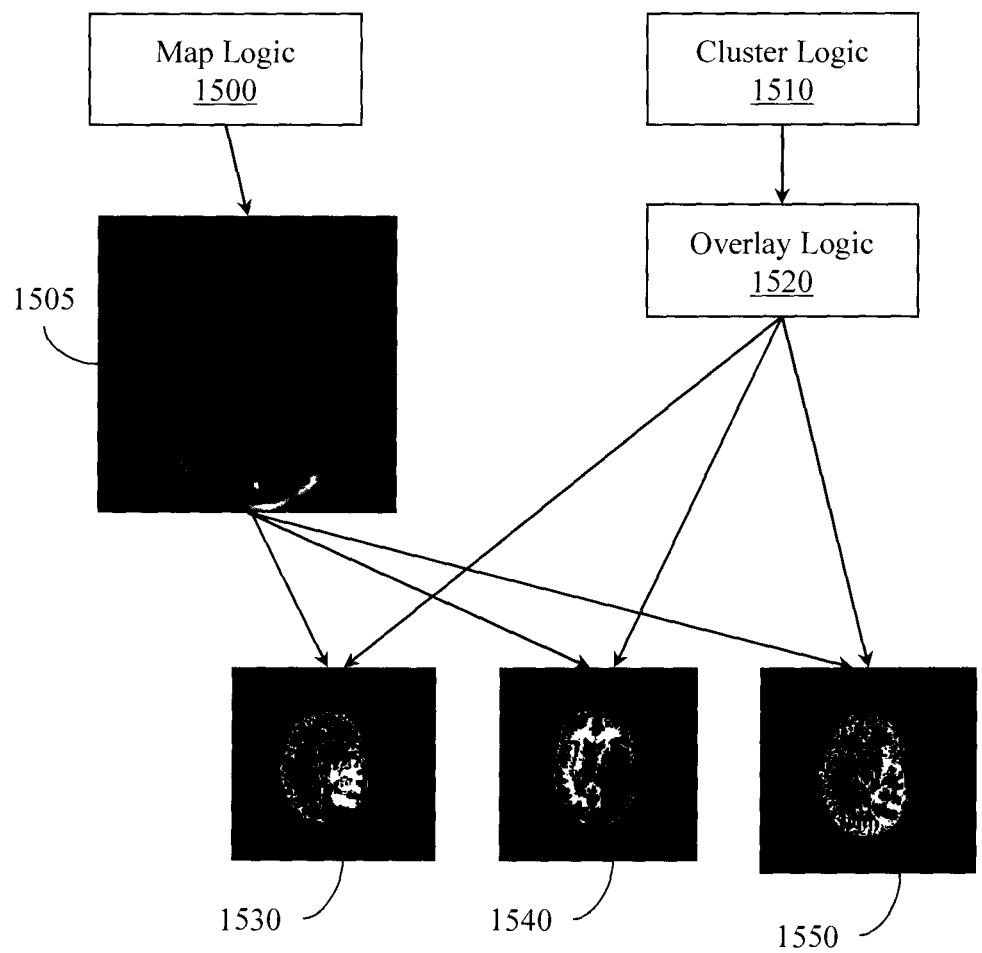
FIG. 15 illustrates overlaid maps being produced in parallel from MR parameter data produced simultaneously by an MRF apparatus.

FIG. 15 illustrates a map logic 1500 producing an MR map 1505. FIG. 15 also illustrates a cluster logic 1510 providing cluster data to an overlay logic 1520. The cluster data may indicate related groups of pixels to be displayed together as an overlay on MR map 1505. Overlay logic 1520 may combine different overlays with MR map 1505 to produce, for example, overlaid maps 1530, 1540, and 1550. In one embodiment, since the MR parameters may be determined simultaneously using MRF, overlay logic 1520 may produce the multiple overlay maps simultaneously (e.g., in parallel).

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one of, A, B, and C" is employed herein, (e.g., a data store configured to store one of, A, B, and C) it is intended to convey the set of possibilities A, B, and C, (e.g., the data store may store only A, only B, or only C). It is not intended to require one of A, one of B, and one of C. When the applicants intend to indicate "at least one of A, at least one of B, and at least one of C", then the phrasing "at least one of A, at least one of B, and at least one of C" will be employed.

To the extent that the phrase "one or more of, A, B, and C" is employed herein, (e.g., a data store configured to store one or more of, A, B, and C) it is intended to convey the set of possibilities A, B, C, AB, AC, BC, ABC, AA . . . A, BB . . . B, CC . . . C, AA . . . ABB . . . B, AA . . . ACC . . . C, BB . . . BCC . . . C, or AA . . . ABB . . . BCC . . . C (e.g., the data store may store only A, only B, only C, A&B, A&C, B&C, A&B&C, or other combinations thereof including multiple instances of A, B, or C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A method, comprising:
  accessing a set of known signal evolutions;
  accessing an acquired nuclear magnetic resonance (NMR) signal, where the acquired NMR signal is acquired from a volume that contains one or more resonant species that simultaneously produced individual NMR signals in response to magnetic resonance fingerprinting (MRF) excitation using random or pseudo-random imaging parameters;
  finding a selected entry in the set of known signals that matches the acquired NMR signal;
  identifying two or more magnetic resonance (MR) parameters for the volume based on stored MR parameters associated with the selected entry, where the two or more MR parameters include:
    a default or natural alignment to which spins align when placed in a main magnetic field ($M_0$) of an MRI system used to acquire the NMR signal; and
    at least one of T1 relaxation associated with the resonance species, T2 relaxation associated with the resonant species, off-resonance relaxation associated with the resonant species, and diffusion weighted relaxation associated with the resonant species, T1 being spin-lattice relaxation, T2 being spin-spin relaxation, and
  assigning the volume that produced the acquired NMR signal to a cluster in a plurality of clusters based on the two or more MR parameters,
  where the set of known signal evolutions includes a signal selected from a set of signals described by:

$$S_i = R_i E_i (S_{i-1})$$

where:
  $S_0$ is the default or equilibrium magnetization,
  $S_i$ is a vector that represents the different components of the magnetization Mx, My, Mz during acquisition block i,
  $R_i$ is the combination of rotational effects that occur during acquisition block i, and
  $E_i$ is the combination of effects that alter the amount of magnetization in the different states for acquisition block i.

2. The method of claim 1, where assigning the volume to the cluster is performed using k-means clustering, where k is a number that identifies the number of clusters into which a data space associated with the acquired NMR signal is partitioned.

3. The method of claim 2, comprising selecting k as a function of the number of expected material components in the volume.

4. The method of claim 1, where the volume is located in a human tissue.

5. The method of claim 4, where the plurality of clusters includes a cluster associated with normal tissue and a cluster associated with abnormal tissue.

6. The method of claim 1, where the volume is located in a human brain.

7. The method of claim 6, where the plurality of clusters includes a cluster associated with grey matter, a cluster associated with white matter, and a cluster associated with cerebrospinal fluid (CSF).

8. The method of claim 7, where the plurality of clusters includes a cluster associated with a tumor core, a cluster associated with tumor edema, and a cluster associated with an aggressive tumor growth region.

9. The method of claim 1, where a member of the plurality of clusters is defined by a relationship between two MR parameters.

10. The method of claim 9, where the two MR parameters are T1 and T2.

11. The method of claim 1, where a member of the plurality of clusters is defined by a relationship between three MR parameters.

12. The method of claim 11, where the three MR parameters are T1, T2, and M0.

13. The method of claim 1, comprising producing and displaying one or more MR maps from a plurality of acquired NMR signals.

14. The method of claim 1, comprising producing and displaying two or more different MR maps from a plurality of acquired NMR signals, where the two or more different MR maps are produced in parallel.

15. The method of claim 13, comprising producing and displaying one or more MR overlays from a plurality of acquired NMR signals.

16. The method of claim 14, comprising producing and displaying two or more different MR overlays from a plurality of acquired MR signals, where the two or more different MR overlays are produced in parallel.

17. The method of claim 15, comprising producing and displaying a combined display from the one or more MR maps and the one or more MR overlays.

18. The method of claim 16, comprising producing and displaying two or more different combined displays from the two or more different MR maps and the two or more different MR overlays.

19. The method of claim 1, where the volume is assigned to the cluster with an accuracy of at least 99%.

20. The method of claim 1, where the volume is assigned to the cluster with an accuracy of at least 99.9%.

21. The method of claim 1, where the two or more MR parameters include a diffusion coefficient associated with the volume, a spin density associated with the volume, a proton density associated with the volume, a magnetic field to which the volume is exposed, or a gradient field to which the volume was exposed.

22. The method of claim 1, comprising:
controlling an NMR apparatus to apply RF energy to the volume in an object in a series of variable sequence blocks, where a sequence block includes one or more excitation phases, one or more readout phases, and one or more waiting phases,
where the RF energy applied during a sequence block causes the one or more resonant species in the volume to simultaneously produce individual NMR signals, and
where at least one member of the series of variable sequence blocks differs from at least one other member of the series of variable sequence blocks in at least N sequence block parameters, N being an integer greater than one, and
controlling the NMR apparatus to acquire the simultaneously produced individual NMR signals.

23. The method of claim 2, where the sequence block parameters comprise echo time, flip angle, phase encoding, diffusion encoding, flow encoding, radio frequency (RF) pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling.

24. The method of claim 23, comprising:
controlling the NMR apparatus to vary one or more of, the amount of time between sequence blocks in the series of variable sequence blocks, the relative amplitude of RF pulses in sequence blocks in the series of variable sequence blocks, and the relative phase of RF pulses in sequence blocks in the series of variable sequence blocks.

25. The method of claim 1, where the set known signal evolutions includes signal evolutions outside the set of signal evolutions characterized by:

$$SE = A - Be^{-t/C}$$

where:
SE is a signal evolution,
A is a constant,
B is a constant,
T is time, and
C is a single relaxation parameter.

26. The method of claim 1, where the set of known signal evolutions includes a signal selected from a set of signals described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T1, T2, D) M_0$$

where:
SE is a signal evolution,
$N_S$ is a number of spins,
$N_A$ is a number of sequence blocks,
$N_{RF}$ is a number of RF pulses in a sequence block,
$\alpha$ is a flip angle,
$\Phi$ is a phase angle,
$R_i(\alpha)$ is a rotation due to off resonance,
$R_{RF_{ij}}(\alpha, \Phi)$ is a rotation due to RF differences,
$R(G)$ is a rotation due to a gradient,
T1 is a spin-lattice relaxation,
T2 is a spin-spin relaxation,
D is diffusion relaxation, and
$E_i(T1, T2, D)$ is decay due to relaxation differences.

27. The method of claim 1, where the set of known signal evolutions includes a signal selected from a set of signals described by:

$$SE = \sum_{s=1}^{N_S} \prod_{i=1}^{N_A} \prod_{j=1}^{N_{RF}} R_i(\alpha) R_{RF_{ij}}(\alpha, \phi) R(G) E_i(T1, T2, D) M_0$$

where:
SE is a signal evolution,
$N_S$ is a number of spins,
$N_A$ is a number of sequence blocks,
$N_{RF}$ is a number of RF pulses in a sequence block,
$\alpha$ is a flip angle,
$\Phi$ is a phase angle,
$R_i(\alpha)$ is a rotation due to off resonance,
$R_{RF_{ij}}(\alpha, \Phi)$ is a rotation due to RF differences,
$R(G)$ is a rotation due to a gradient,
T1 is a spin-lattice relaxation,
T2 is a spin-spin relaxation, and
$E_i(T1, T2, \ldots)$ is decay due to relaxation differences.

28. A method, comprising:
accessing a set of known signal evolutions;
accessing an acquired nuclear magnetic resonance (NMR) signal, where the acquired NMR signal is acquired from a volume that contains one or more resonant species that simultaneously produced individual NMR signals in response to magnetic resonance fingerprinting (MRF) excitation using random or pseudo-random imaging parameters;
finding a selected entry in the set of known signals that matches the acquired NMR signal;
identifying two or more magnetic resonance (MR) parameters for the volume based on stored MR parameters associated with the selected entry, where the two or more MR parameters include:
a default or natural alignment to which spins align when placed in a main magnetic field ($M_0$) of an MRI system used to acquire the NMR signal; and
at least one of T1 relaxation associated with the resonance species, T2 relaxation associated with the resonant species, off-resonance relaxation associated with the resonant species, and diffusion weighted relaxation associated with the resonant species, T1 being spin-lattice relaxation, T2 being spin-spin relaxation, and
assigning the volume that produced the acquired NMR signal to a cluster in a plurality of clusters based on the two or more MR parameters
where the set of known signal evolutions includes a signal selected from a set of signals described by:

$$S_i = R_i E_i \sum_{x=1}^{i-1} R_x E_x(S_x)$$

or $$S_i = R_i E_i \Pi_{x=1}^{i-1} R_x E_x(S_x)$$

where:

$S_0$ is the default or equilibrium magnetization, $S_i$ is a vector that represents the different components of the magnetization Mx, My, Mz during acquisition block i, $R_i$ is the combination of rotational effects that occur during acquisition block i, and $E_i$ is the combination of effects that alter the amount of magnetization in the different states for acquisition block i.

29. A method, comprising:

accessing a set of known signal evolutions;

accessing an acquired nuclear magnetic resonance (NMR) signal, where the acquired NMR signal is acquired from a volume that contains one or more resonant species that simultaneously produced individual NMR signals in response to magnetic resonance fingerprinting (MRF) excitation using random or pseudo-random imaging parameters;

finding a selected entry in the set of known signals that matches the acquired NMR signal;

identifying two or more magnetic resonance (MR) parameters for the volume based on stored MR parameters associated with the selected entry, where the two or more MR parameters include:

a default or natural alignment to which spins align when placed in a main magnetic field ($M_0$) of an MRI system used to acquire the NMR signal; and at least one of T1 relaxation associated with the resonance species, T2 relaxation associated with the resonant species, off-resonance relaxation associated with the resonant species, and diffusion weighted relaxation associated with the resonant species, T1 being spin-lattice relaxation, T2 being spin-spin relaxation, and assigning the volume that produced the acquired NMR signal to a cluster in a plurality of clusters based on the two or more MR parameters where the set of known signal evolutions includes a signal selected from a set of signals described by:

$$S_i = \sum_{s=1}^{N_s} R_{s,i} E_{s,i} \sum_{x=1}^{i-1} R_{s,x} E_{s,x}(S_{s,x})$$

or $$S_i = \sum_{s=1}^{N_s} R_{s,i} E_{s,i} \Pi_{x=1}^{i-1} R_{s,x} E_{s,x}(S_{s,x})$$

where:

$S_0$ is the default or equilibrium magnetization, $N_s$ is the number of spins, $S_i$ is a vector that represents the different components of the magnetization Mx, My, Mz during acquisition block i, $R_i$ is the combination of rotational effects that occur during acquisition block i, and $E_i$ is the combination of effects that alter the amount of magnetization in the different states for acquisition block i.

30. An apparatus, comprising:

a nuclear magnetic resonance (NMR) logic that receives a first set of data from a magnetic resonance fingerprinting (MRF) apparatus that repetitively and variably samples a (k, t, E) space associated with an object to acquire a set of NMR signals, where members of the first set of data are associated with different points in the (k, t, E) space, where t is time and E includes a set of at least one of T1, T2, and one other parameter, T1 being spin-lattice relaxation, and T2 being spin-spin relaxation, and where one or more oft and E vary non-linearly, where the (k, t, E) space is produced as a function of applying RF energy to the object according to a magnetic resonance fingerprinting (MRF) approach:

a signal logic that produces an NMR signal evolution from the first set of data;

a matching logic that selects from a collection of stored signal evolutions a stored signal evolution that most closely matches the NMR signal evolution;

a characterization logic that characterizes the object based, at least in part, on two or more magnetic resonance (MR) parameters associated with the selected signal evolution and at least one of the two or more MR parameters including a default or natural alignment to which spins align when placed in a main magnetic field ($M_0$) of an MRI system used to acquire the NMR signal and, and a cluster logic that assigns a location in the object that produced the first set of data to a cluster selected from a plurality of clusters, where the plurality of clusters represent Voronoi groups produced by a k-means analysis, and where the plurality of clusters segment an MR parameter data space associated with the object, where the cluster logic selects the cluster from the plurality of clusters in response to performing a k-means clustering analysis on the two or more MR parameters associated with the selected signal evolution, and where the cluster logic assigns the location in the object to the cluster with an accuracy of at least 99.7%, where the set of known signal evolutions includes a signal selected from a set of signals described by:

$$S_i = \sum_{s=1}^{N_s} R_{s,i} E_{s,i}(S_{s,i-1})$$

where:

$S_0$ is the default or equilibrium magnetization, $N_s$ is the number of spins, $S_i$ is a vector that represents the different components of the magnetization Mx, My, Mz during acquisition block i, $R_i$ is the combination of rotational effects that occur during acquisition block i, and $E_i$ is the combination of effects that alter the amount of magnetization in the different states for acquisition block i.

31. The apparatus of claim 30, comprising an image logic that produces an MR image of the object based, at least in part, on the first set of data.

32. The apparatus of claim 31, comprising an overlay logic that produces an overlay for the MR image, where the overlay provides images associated with data from one or more clusters from the plurality of clusters.

33. The apparatus of claim 30, where the clusters are associated with different types of human tissue.

34. The apparatus of claim 30, where the characterization logic provides information concerning T1 associated with the object, T2 associated with the object, a diffusion coefficient associated with the object, a spin density associated with the object, a proton density associated with the object, a magnetic field to which the object was exposed, a gradient field to which the object was exposed, a tissue type of the object, or an identification of the object.

35. A magnetic resonance imaging (MRI) apparatus, comprising:
- a data store that stores a dictionary of magnetic resonance fingerprinting (MRF) signal evolutions;
- a collection logic that collects a received signal evolution from a tissue experiencing nuclear magnetic resonance (NMR) in response to an MRF excitation applied to the tissue by the MRI apparatus;
- a selection logic that selects a member of the dictionary that correlates with the signal evolution;
- a characterization logic that identifies, from the member, two or more magnetic resonance (MR) parameters associated with the tissue,
- an identification logic that identifies, from the two or more MR parameters, a tissue type associated with the tissue,
- an image logic that produces an MR image from a plurality of signal evolutions received from the tissue, and
- a segmentation logic that segments the MR image into two or more segments based on tissue types distinguished by a k-means cluster analysis of the dictionary or signal evolution, where the signal evolution is described by a summation on $j$:

$$SE = \sum_{s=1}^{N_s} \prod_{i=1}^{N_A} \sum_{j=1}^{N_{RF}} R_i(\alpha) R_{RF_{ij}}(\alpha, \phi) R(G) E_i(T1, T2, D) M_0$$

or by a product on $j$:

$$SE = \sum_{s=1}^{N_s} \prod_{i=1}^{N_A} \prod_{j=1}^{N_{RF}} R_i(\alpha) R_{RF_{ij}}(\alpha, \phi) R(G) E_i(T1, T2, D) M_0$$

where:
SE is a signal evolution,
$N_s$ is a number of spins,
$N_A$ is a number of sequence blocks,
$N_{RF}$ is a number of RF pulses in a sequence block,
$\alpha$ is a flip angle,
$\Phi$ is a phase angle,
$R_i(\alpha)$ is a rotation due to off resonance,
$R_{RF_{ij}}(\alpha, \Phi)$ is a rotation due to RF differences,
$R(G)$ is a rotation due to a gradient,
T1 is spin-lattice relaxation,
T2 is spin-spin relaxation,
$E_i(T1, T2 \ldots)$ is decay due to relaxation differences, and
$M_0$ is the default or natural alignment to which spins align when placed in the main magnetic field.

* * * * *